US006531353B2

United States Patent
Lee (10) Patent No.: US 6,531,353 B2
(45) Date of Patent: Mar. 11, 2003

(54) METHOD FOR FABRICATING SEMICONDUCTOR DEVICE

(75) Inventor: Ki Jik Lee, Chungcheongbuk-do (KR)

(73) Assignee: Hynix Semiconductor, Inc., Kyoungki-Do (KR)

(*) Notice: Subject to any disclaimer, the term of this patent is extended or adjusted under 35 U.S.C. 154(b) by 0 days.

(21) Appl. No.: 09/905,987

(22) Filed: Jul. 17, 2001

(65) Prior Publication Data

US 2002/0045305 A1 Apr. 18, 2002

(30) Foreign Application Priority Data

Oct. 18, 2000 (KR) .......................... 2000-61347

(51) Int. Cl.[7] .................. H01L 21/8242; H01L 21/302; H01L 21/311
(52) U.S. Cl. ................. 438/210; 438/200; 438/230; 438/241; 438/632; 438/633; 438/692; 438/698
(58) Field of Search ............... 438/199, 200, 438/210, 230, 241, 631, 632, 633, 692, 697, 698

(56) References Cited

U.S. PATENT DOCUMENTS 6,291,279 B1 * 5/2000 Hsiao et al. .............. 438/197
6,342,449 B2 * 1/2002 Miyakawa ................. 438/692
6,344,389 B1 * 2/2002 Bronner et al. ........... 438/244

OTHER PUBLICATIONS

Wolf et al., "Chemical Vapor Deposition of Amorphous and Polycrystalline Films", Silicon Processing for the VLSI Era—vol. 1: Process Technology, Lattice Press, 1986 (pp. 182–185,189–191).*

* cited by examiner

Primary Examiner—Amir Zarabian
Assistant Examiner—Toniai M. Thomas
(74) Attorney, Agent, or Firm—Morgan, Lewis & Bockius LLP

(57) ABSTRACT

A method for fabricating a semiconductor device is disclosed, which reduces defects of a device by improving the process to improve the production yield. The method for fabricating a semiconductor device includes the steps of forming a device barrier region in a semiconductor substrate to form an active region and a field region, forming a plurality of logic gates in a logic region, forming a plurality of DRAM gates in a DRAM cell region and a DRAM peripheral region, forming insulating film sidewalls at both sides of the logic gate and the DRAM gates, forming source and drain regions in the semiconductor substrate at both sides of the DRAM gates formed in the logic gate and the DRAM peripheral region, depositing a first inter layer dielectric (ILD) film on an entire surface of the semiconductor substrate, removing the first ILD film of the DRAM cell region at a predetermined depth to remove a void formed between the DRAM gates during depositing of the first ILD film, forming a second ILD film in a portion, where the first ILD film is removed, to remove a step difference between the DRAM cell region and the other region, and forming a plug connected with the semiconductor substrate of the DRAM cell region by penetrating a first ILD film and a second ILD film.

13 Claims, 7 Drawing Sheets

METHOD FOR FABRICATING SEMICONDUCTOR DEVICE

BACKGROUND OF THE INVENTION

1. Field of the Invention

The present invention relates to a semiconductor device, and more particularly, to a method for fabricating a semiconductor device that reduces defects of a device by improving the process to improve the production yield.

2. Background of the Related Art

Generally, in a fabricating process of a Merged DRAM on Logic (MDL) device, a source, a drain, and a silicide are formed in a logic region and then an Inter Layer Dielectric (ILD) process for fabricating a DRAM cell capacitor is performed.

Also, with high packing density of a semiconductor device, a pitch of a wordline decreases, so that the ILD process necessarily requires a flowing process at a high temperature.

However, the flowing process, which is performed at a high temperature after forming the logic device, degrades characteristic of the logic device, so that defects of the device occur.

A related art method for fabricating a semiconductor device will be described with reference of the accompanying drawings.

FIG. 1A to FIG. 1F are sectional views illustrating fabricating process steps of a related art semiconductor device.

Figure 1A:
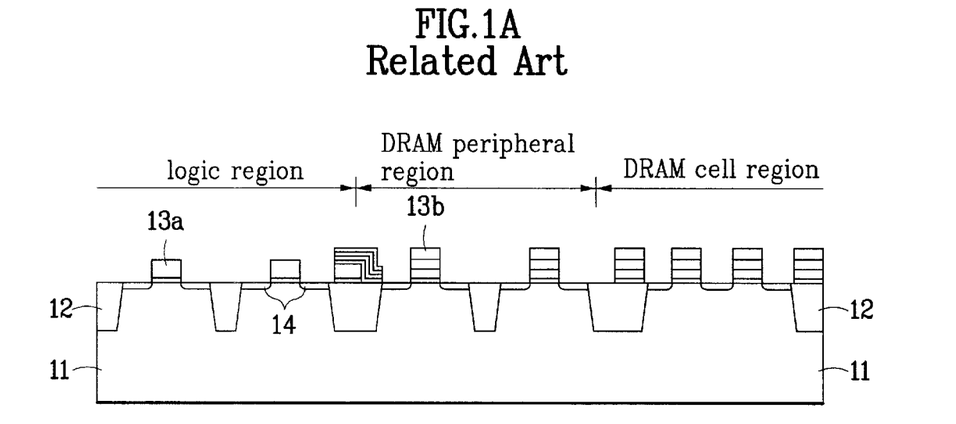
FIG. 1A to FIG. 1F are sectional views illustrating fabricating process steps of a related art semiconductor device.

First, as shown in FIG. 1A, a field oxide film 12 is formed in a predetermined region of a semiconductor substrate 11 by a shallow trench isolation (STI) process to define an active region.

Then, a gate oxide film and a polysilicon film are deposited on the semiconductor substrate 11. The polysilicon film and the gate oxide film are selectively removed by photolithography and etching processes to remain on a predetermined region of the semiconductor substrate 11 corresponding to a logic region, so that a plurality of logic gates 13a are formed.

Subsequently, a gate oxide film, a polysilicon film, a tungsten film, a silicon nitride film, and an oxide film are sequentially deposited on an entire surface of the semiconductor substrate 11. The oxide film, the silicon nitride film, the tungsten film, the polysilicon film, the gate oxide film are selectively removed by photolithography and etching processes to remain on a predetermined region of the semiconductor substrate 11 corresponding to a DRAM peripheral region and a DRAM cell region, so that a plurality of DRAM gates 13b are formed.

Lightly doped impurity ions are injected into the entire surface of the semiconductor substrate 11 using the gates 13a and 13b as masks, so that a Lightly Doped Drain (LDD) region is formed in the semiconductor substrate 11 corresponding to an active region at both sides of the gates 13a and 13b.

Figure 1B:
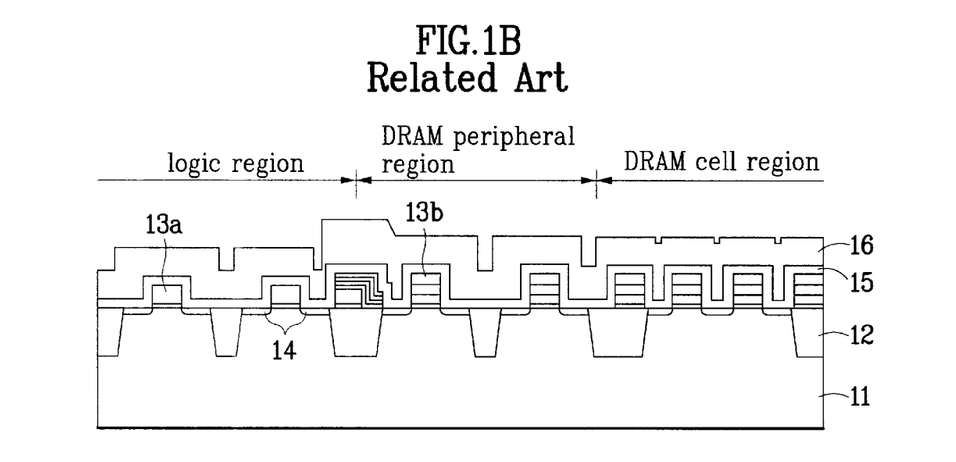

AS shown in FIG. 1B, a first High temperature Low Deposition (HLD) film 15 and a nitride film (not shown) are sequentially deposited on the surface of the semiconductor substrate 11, and a first Boron Phosphorus Silicate Glass (BPSG) film 16 is formed on the nitride film at a predetermined thickness.

Herein, the first BPSG film 16 is deposited by the flowing process at high temperature between 800° C. and 840° C.

Figure 1C:
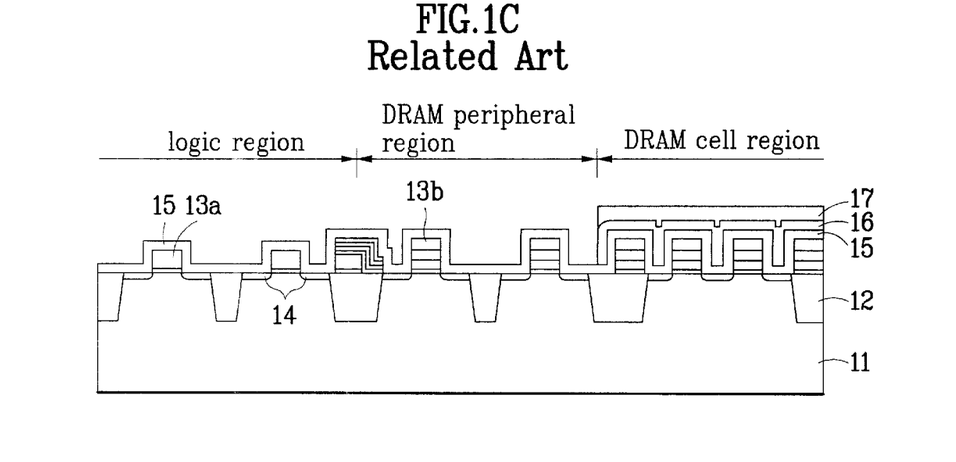

As shown in FIG. 1C, a first photoresist 17 is deposited on the semiconductor substrate 11, and the first photoresist 17 is selectively patterned by exposure and developing processes to open the logic region and the DRAM peripheral region.

Subsequently, the first BPSG film 16 on the logic region and the DRAM peripheral region is removed by a wet-etching process using the patterned first photoresist 17 as a mask, and then the first photoresist 17 is removed. In this case, the DRAM cell region in a boundary portion between the DRAM cell region and the DRAM peripheral region is partially etched by the wet-etching process.

Figure 1D:
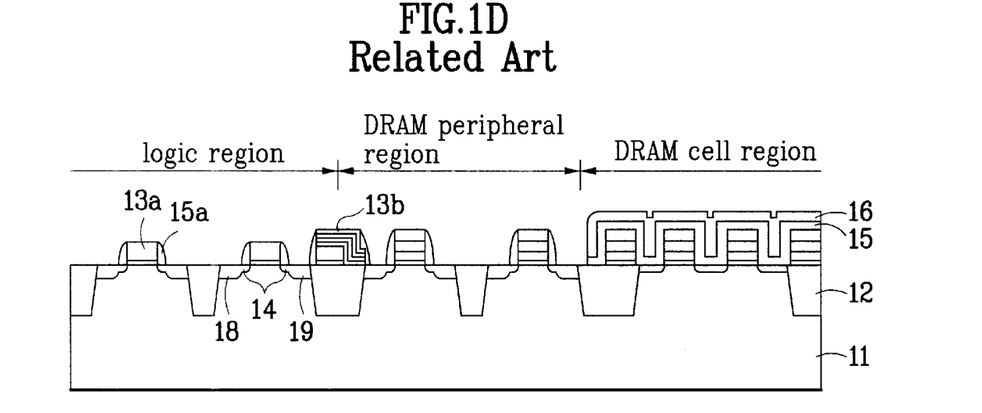

As shown in FIG. 1D, the first HLD film 15 and the nitride film are selectively removed by an etch-back process to remain at both sides of the logic gate 13a and the DRAM gate 13b of the DRAM peripheral region, so that insulating film sidewalls 15a are formed by the first HLD film 15.

Heavily doped impurity ions are injected into the entire surface of the semiconductor substrate 11. Then, source and drain regions 18 and 19 are formed in the semiconductor substrate 11 corresponding to the active region at both sides of the insulating film sidewalls 15a.

A second HLD film is deposited on the surface of the semiconductor substrate 11 to protect a cell region and an input/output (I/O) (not shown). Then, the second HLD film is selectively removed by photolithography and etching processes to remain only on the cell region and the I/O region.

Figure 1E:
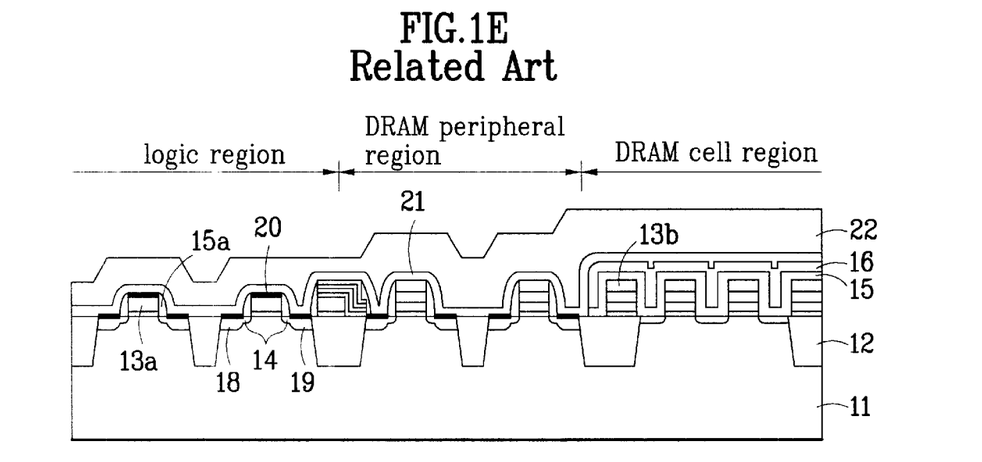

As shown in FIG. 1E, cobalt is deposited on the entire surface of the semiconductor substrate 11 and then annealed, so that a cobalt silicide film 20 is formed on the surfaces of the logic gate 13a, the source region 18, and the drain region 19.

Herein, the cobalt silicide film 20 is formed on the surfaces of the logic gate 13a, the source region 18 and the drain region 19 by reacting silicon with cobalt. However, the DRAM gate 13b of the DRAM peripheral region consists of oxide films on an upper surface, so that the cobalt silicide film is not formed.

The remaining cobalt, which is not reacted with silicon, is then removed.

As a third HLD film 21 is deposited on the surface of the semiconductor substrate 11, and a second BPSG film 22 is deposited by a flowing process at a low temperature. Then, a rapid thermal annealing (RPA) process is performed.

Figure 1F:
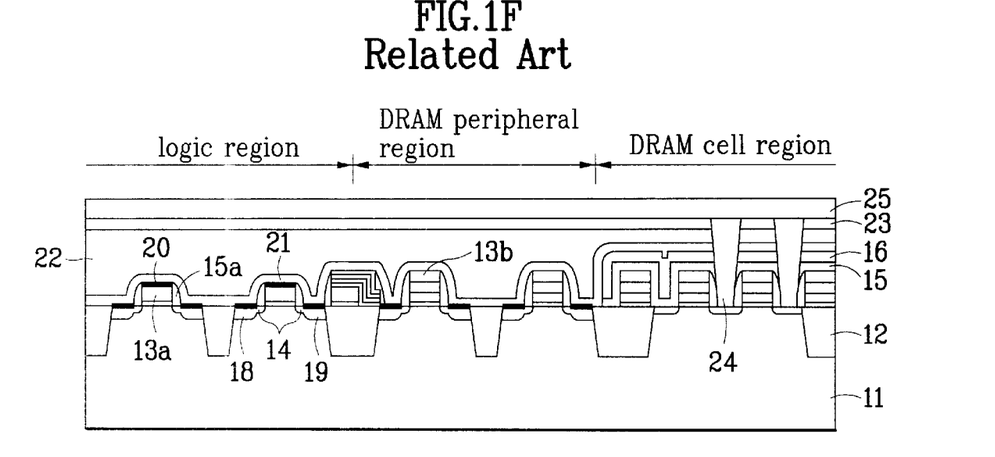

As shown in FIG. 1F, the surface of the second BPSG film 22 is flattened by a chemical mechanical polishing (CMP) process.

Subsequently, a fourth HLD film 23 is deposited on the second BPSG film 22. Then, the fourth HLD film 23, the second BPSG film 22, the third HLD film 21, the first BPSG film 16 and the first HLD film 15 are sequentially removed by photolithography and etching process to expose the semiconductor substrate 11 of the DRAM cell region corresponding to the active region, so that a trench is formed.

A plug poly is deposited on the entire surface of the semiconductor substrate 11 including the trench, and then etched back, so that a plug 24 is formed within the trench.

A fifth HLD film 25 is finally deposited on the semiconductor substrate 11. Thus, the related art semiconductor device is completed.

However, the related art method for fabricating a semiconductor device has several problems.

First, since the logic region and the DRAM peripheral region are opened by the wet-etching process, the boundary portion of the DRAM cell region is etched in accordance with characteristic of the wet-etching process. Therefore, a defect occurs in the semiconductor device.

Also, since no insulating film sidewalls are formed at both sides of the DRAM gates corresponding to the DRAM cell region, gap-fill characteristic is deteriorated. For this reason, a void occurs in the plug.

Furthermore, the etching defects according to a DRAM cell area occur during forming the insulating film sidewalls, so that uniformity decreases, thereby increasing defects of the semiconductor device.

Finally, the application of the process for forming a cell capacitor process identical with the existing DRAM is impossible in the present invention. For this reason, characteristics related to self align margin (SAC), leakage, and capacitor are varied. This results in that the cell characteristic is not reliable. Therefore, the production yield decreases.

SUMMARY OF THE INVENTION

Accordingly, the present invention is directed to a method for fabricating a semiconductor device that substantially obviates one or more problems due to limitations and disadvantages of the related art.

An object of the present invention is to provide a method for fabricating a semiconductor device that improves reliability of the device and the production yield.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating semiconductor device includes the steps of forming a device barrier region in a semiconductor substrate to form an active region and a field region, forming a plurality of logic gates in a logic region, forming a plurality of DRAM gates in a DRAM cell region and a DRAM peripheral region, forming insulating film sidewalls at both sides of the logic gate and the DRAM gates, forming source and drain regions in the semiconductor substrate at both sides of the DRAM gates formed in the logic gate and the DRAM peripheral region, depositing a first inter layer dielectric (ILD) film on an entire surface of the semiconductor substrate, removing the first ILD film of the DRAM cell region at a predetermined depth to remove a void formed between the DRAM gates during depositing of the first ILD film , forming a second ILD film in a portion, where the first ILD film is removed, to remove a step difference between the DRAM cell region and the other region , and forming a plug connected with the semiconductor substrate of the DRAM cell region by penetrating a first ILD film and second ILD film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

FIG. 2A to FIG. 2E are sectional views illustrating fabricating process steps of a semiconductor device in accordance with a preferred embodiment of the present invention.

Figure 2A:
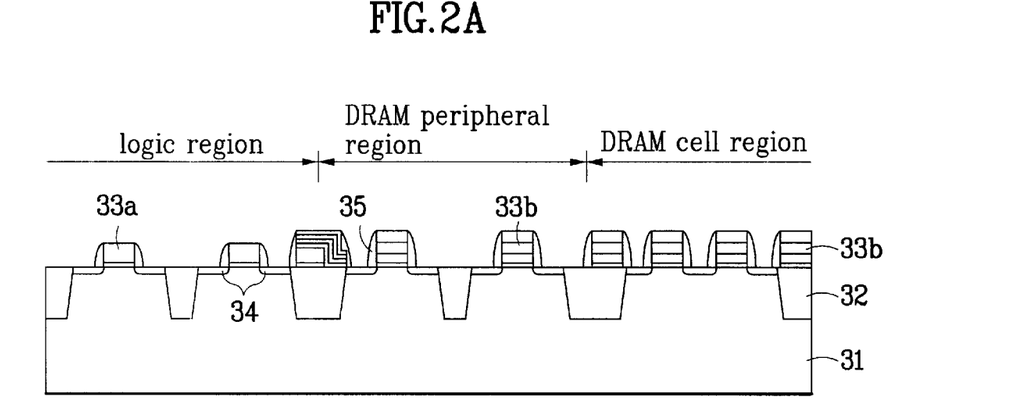
FIG. 2A to FIG. 2E are sectional views illustrating fabricating process steps of a semiconductor device in accordance with a preferred embodiment of the present invention.

As shown in FIG. 2A, a field oxide film 32 is formed in a predetermined region of a semiconductor substrate 31 by a shallow trench isolation (STI) process to define a field region and an active region.

Then, a gate oxide film and a poly-silicon film are deposited on the semiconductor substrate 31. The poly silicon film and the gate oxide film are selectively removed by photolithography and etching processes to remain on a predetermined region of the semiconductor substrate 31 corresponding to a logic region, so that a plurality of logic gates 33$a$ are formed.

Subsequently, a gate oxide film, a poly-silicon film, a tungsten film, a silicon nitride film, and an oxide film are sequentially deposited on an entire surface of the semiconductor substrate 31. The oxide film, the silicon nitride film, the tungsten film, the poly-silicon film, the gate oxide film are selectively removed by photolithography and etching processes to remain on a predetermined region of the semiconductor substrate 31 corresponding to a DRAM peripheral region and a DRAM cell region, so that a plurality of DRAM gates 33$b$ are formed.

Lightly doped impurity ions are injected into the entire surface of the semiconductor substrate 31 using the gate 33$a$ and 33$b$ as masks. Therefore, Lightly Doped Drain (LDD) region 34 is formed in the semiconductor substrate 31 corresponding to an active region at both sides of the gates 33$a$ and 33$b$.

A first HLD film and a nitride film (not shown) sequentially deposited on the surface of the semiconductor substrate 31, and then etched back to remain at both sides of the gates 33$a$ and 33$b$, so that insulating film sidewalls 35 are formed.

Figure 2B:
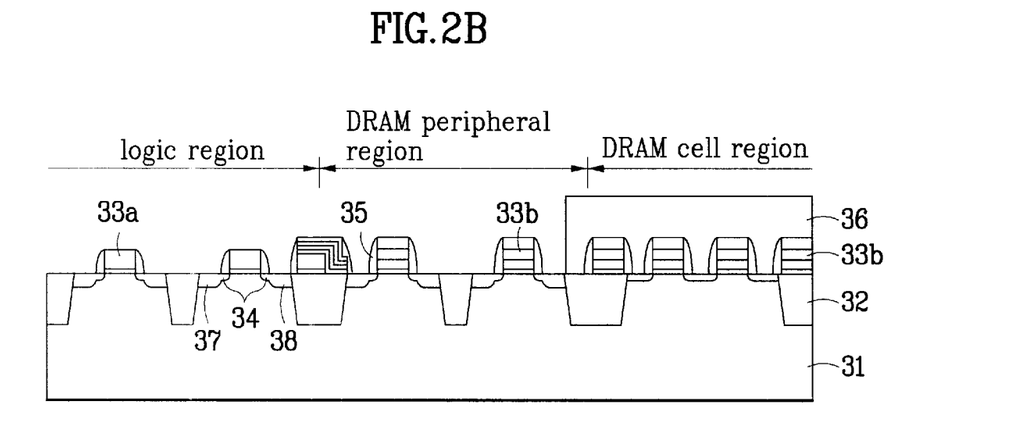

As shown in FIG. 2B, a first photoresist 36 is deposited on the entire surface of the semiconductor substrate 31, and the first photoresist 36 is selectively patterned by exposure and developing processes to open the logic region and the DRAM peripheral region.

Subsequently, heavily doped impurity ions are injected into the semiconductor substrate 31 using the patterned first photoresist 36 as a mask. A source and drain regions are formed in the semiconductor substrate corresponding to the active region at both sides of the insulating film sidewalls 35, and then, the first photoresist 36 is removed.

A second HLD film is deposited on the surface of the semiconductor substrate 11 to protect a cell region and an input/output (I/O) region (not shown) at a thickness of 1000 Å. Then, the second HLD film is selectively removed by photolithography and etching processes to remain only on the cell region and the I/O region.

Figure 2C:
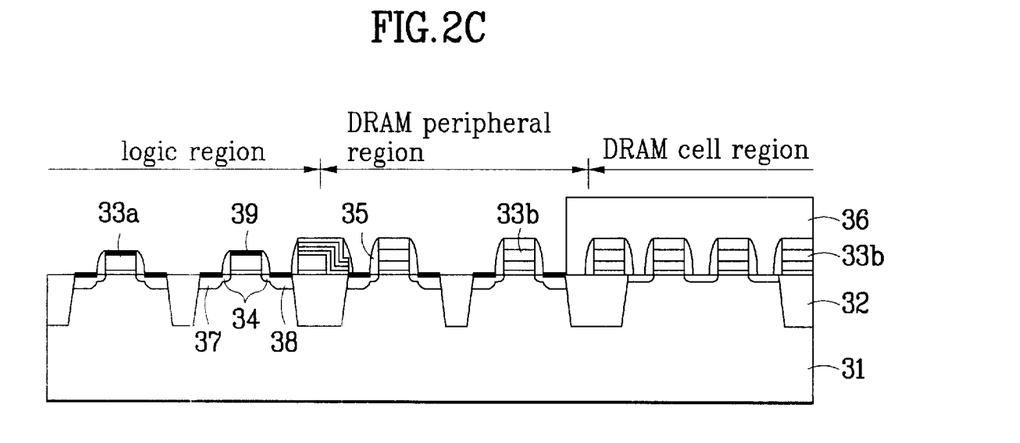

As shown in FIG. 2C, cobalt is deposited on the entire surface of the semiconductor substrate 31, and then annealed, so that a cobalt silicide film 39 is formed on the surfaces of the logic gate 33a, the source region 37, and the drain region 38.

Subsequently, the remaining cobalt, which is not reacted with silicon, is then removed.

Figure 2D:
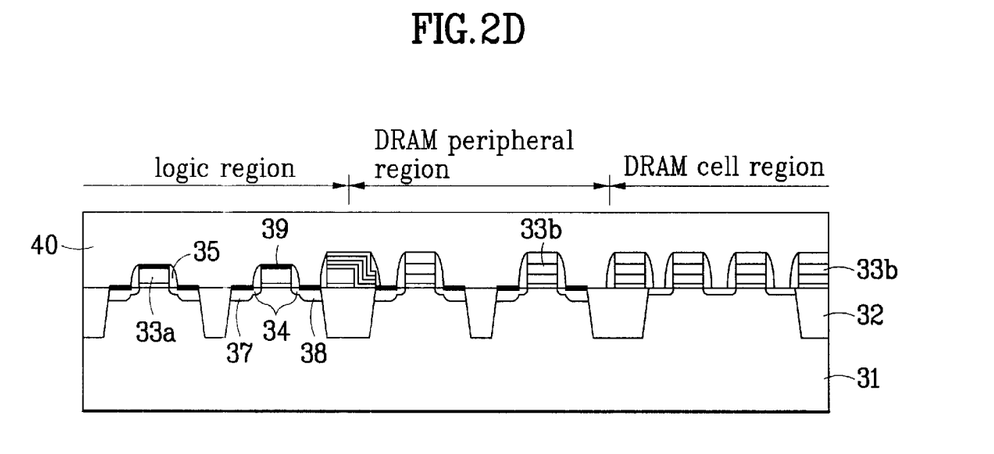
Figure 2E:
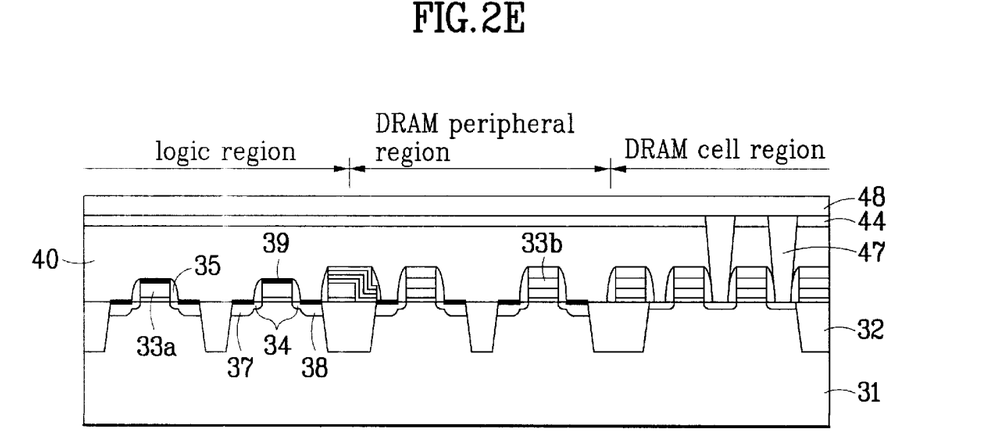

As shown in FIG. 2D, a third HLD film (not shown) is deposited on the surface of the semiconductor substrate 31, and a second BPSG film 40 is deposited on the third HLD film at a thickness of 8000 Å. Then, an annealing process is performed at a low temperature.

Figure 4A:
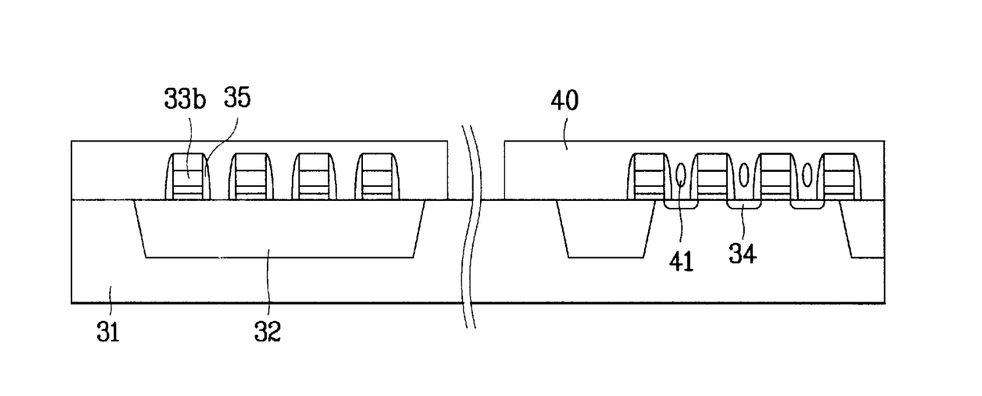
FIG. 4A to FIG. 4F are sectional views illustrating fabricating process steps of a semiconductor device taken along lines 'A—A' and 'B—B' of FIG. 3.

At this time, as shown in FIG. 4A, a void 41 occurs between the respective DRAM gates 33b at the DRAM cell region.

Figure 3:
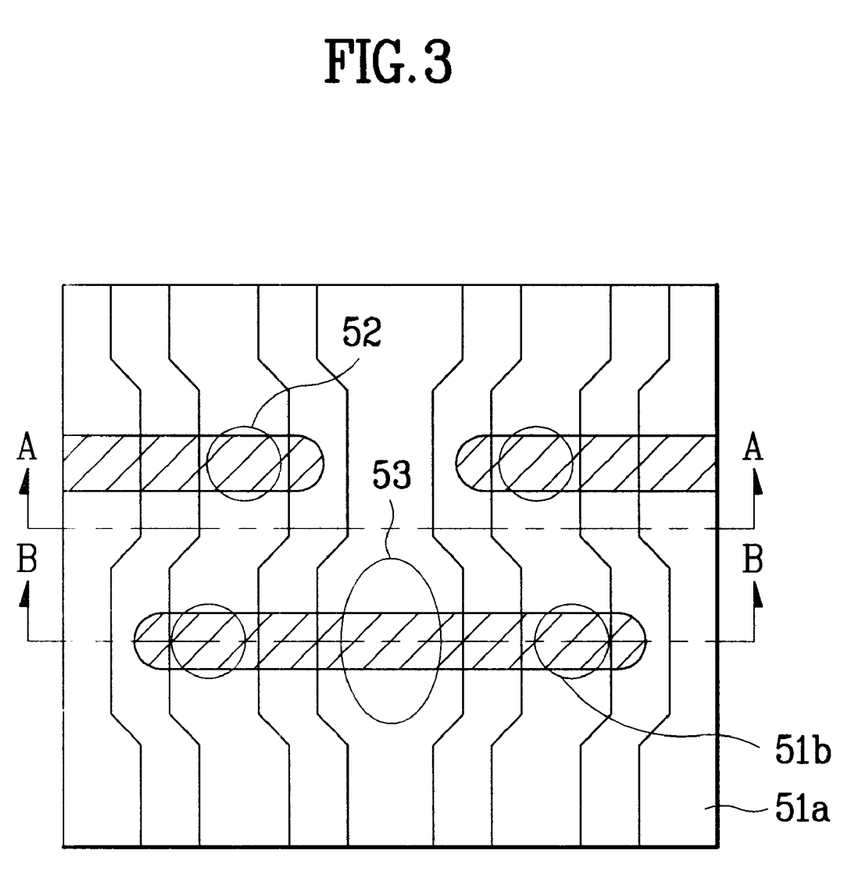
FIG. 3 is a plan view illustrating a DRAM cell region of a semiconductor device in accordance with a preferred embodiment of the present invention.

FIG. 4A to FIG. 4F are sectional views taken along lines 'A—A' and 'B—B' of FIG. 3. Left portions of FIG. 4A to FIG. 4F are sectional views taken along lines 'A—A' of FIG. 3, which is crossed a field region of a semiconductor substrate in which an active region and the field region are defined. Right portions of FIG. 4a to FIG. 4f are sectional views taken along lines 'B—B', which is crossed the active region of the semiconductor substrate.

In FIG. 3, reference numerals 52 and 53, which are not described, respectively denote a bitline contact 52 and a storage node contact 53.

Subsequently, the surface of the BPSG film 40 is flattened by a CMP process.

Figure 4B:
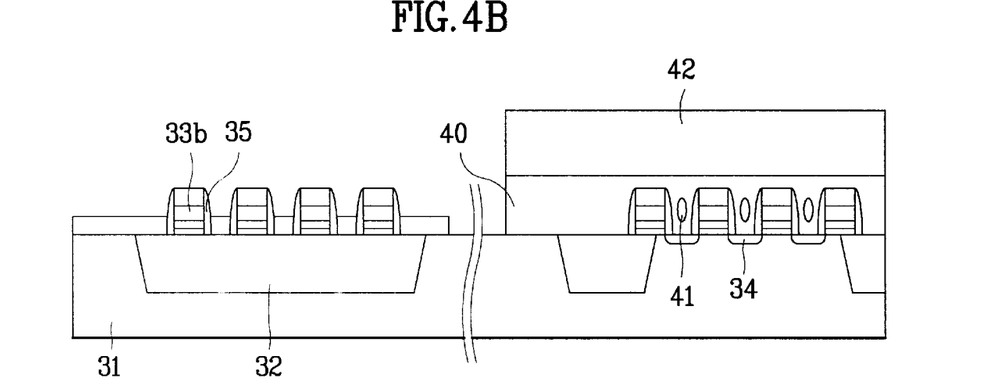

As shown in FIG. 4B, a second photoresist 42 is deposited on the entire surface of a semiconductor substrate 31, and the second photoresist 42 is selectively patterned by the exposure and developing processes to expose the semiconductor substrate corresponding to a field region defined in the DRAM cell region.

The BPSG film 40 is removed using the patterned second photoresist 42 as a mask to expose the predetermined region of the upper portion of the DRAM gate 33b at the field region, and then the second photoresist 42 is removed.

At this time, the BPSG film 40 is removed at a depth to remove a void 41 formed in the inner portion of the BPSG film.

Figure 4C:
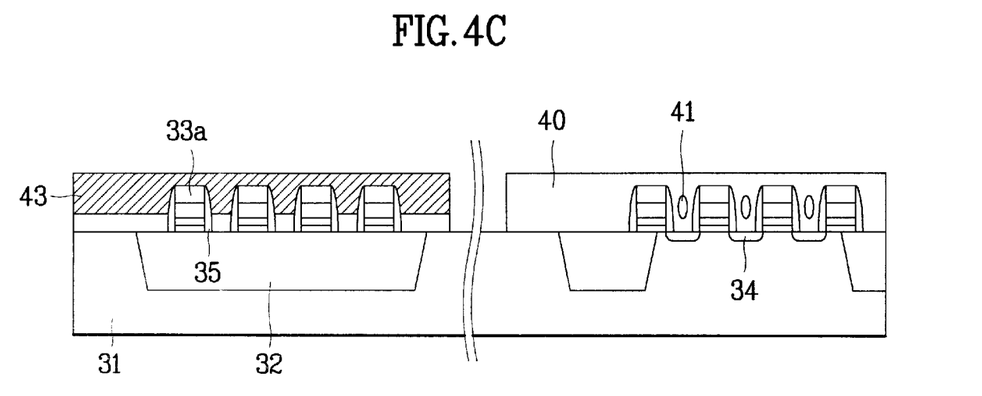

As shown in FIG. 4C, a Spin On Glass (SOG) film 43 is coated on the surface of the semiconductor substrate 31 at the thickness between 1900 Å and 2100 Å, and etched back the entire surface of the semiconductor substrate to remove the step difference with the BPSG film 40 of the active region.

Figure 4D:
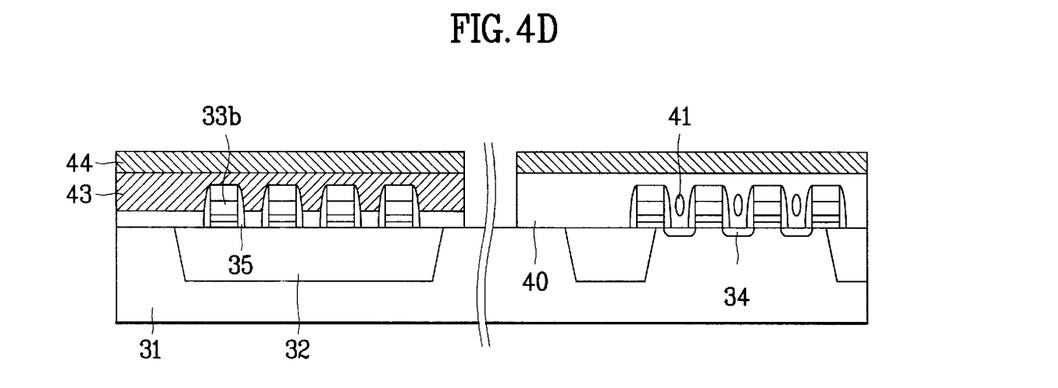

As shown in FIG. 4D, a fourth HLD film 44 is deposited on the semiconductor substrate 31.

Figure 4E:
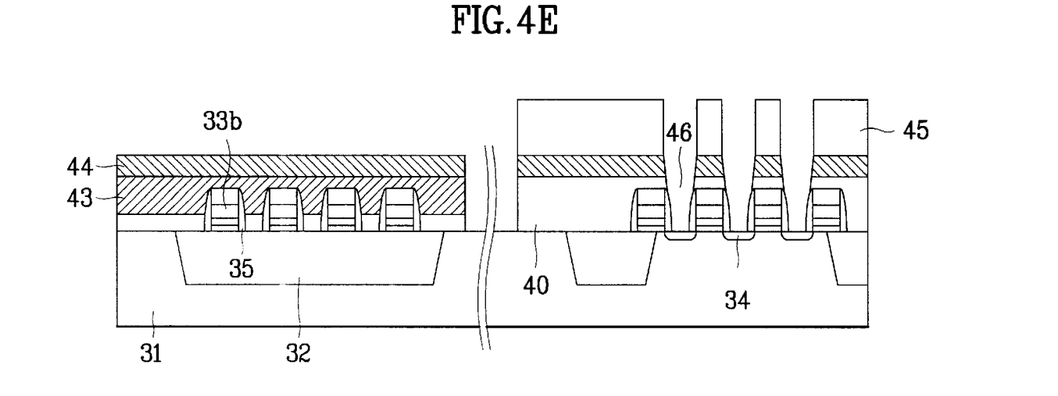

As shown in FIG. 4E, a third photoresist 45 is deposited on the semiconductor substrate 31, and the patterned by exposure and developing processes to expose the upper portion of the semiconductor substrate 31 at the active region defined in DRAM cell region.

The fourth HLD film 44 and the BPSG film 40 are removed using the patterned third photoresist 45 as a mask to expose the semiconductor substrate corresponding to the active region, so that a trench 46 is formed.

Figure 4F:
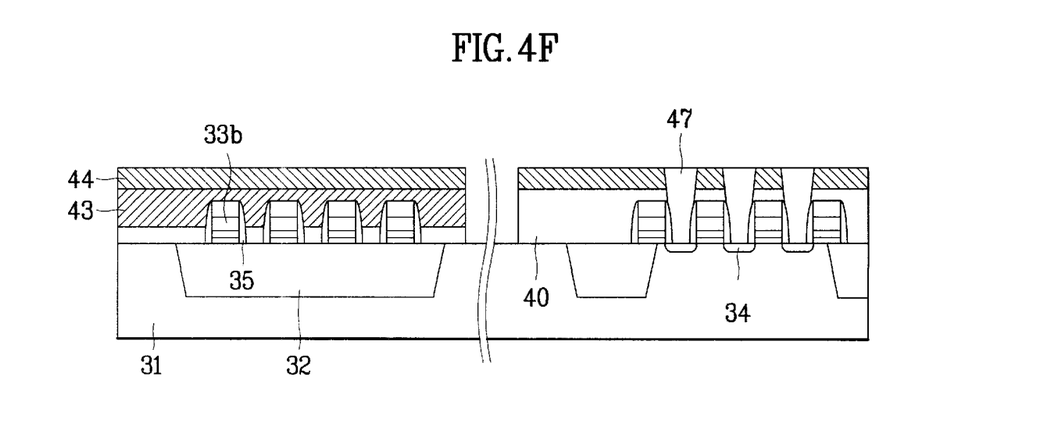

As shown in FIG. 4F, a plug poly is deposited on the entire surface of the semiconductor substrate 31 including the trench 46, and then etched back, so that a plug 47 is formed within the trench 46.

A fifth HLD film 48 is finally deposited on the entire surface of the semiconductor substrate 31, the semiconductor device is completed in accordance with the present invention.

As has been explained, the method for fabricating a semiconductor device according to the present invention has the following advantages.

First, SAC process identical with the present DRAM device is performed and the same capacitor and the characteristic are obtained.

Since the void is removed, it is possible to prevent short effect between the plugs from occurring.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method for fabricating a semiconductor device, comprising the steps of:

forming a device baffler region in a semiconductor substrate to form an active region and a field region;

forming a plurality of logic gates in a logic region;

forming a first plurality of DRAM gates in a DRAM cell region and a second plurality of DRAM gates in a DRAM peripheral region;

forming insulating film sidewalls on opposing sidewall portions of the plurality of logic gates and the first and second pluralities of DRAM gates;

forming source and drain regions in the semiconductor substrate at both sides of the plurality of logic gates and the first and second pluralities of DRAM gates;

depositing a first dielectric film on an entire surface of the semiconductor substrate and upon upper surface portions of the first and second pluralities of DRAM gates;

removing a first portion of the first dielectric film within the DRAM cell region at a predetermined depth below the upper surface portions of the first plurality of DRAM gates to expose a second portion of the first dielectric film and to remove voids formed between the first plurality of DRAM gates during the depositing of the first dielectric film;

forming a second dielectric film upon the second portion of the first dielectric film to cover the upper surface portions of the first plurality of DRAM gates and to remove a step difference between the DRAM cell region and the logic and DRAM peripheral regions; and forming a plug connected with the semiconductor substrate of the DRAM cell region by nenetratina the first dielectric film.

2. A method as claimed in claim 1, further comprising the step of injecting lightly doped impurity ions using the logic gate and the DRAM gates as masks to form a lightly doped drain (LDD) region, after forming the logic gate and the DRAM gates.

3. A method as claimed in claim 1, wherein the source and drain regions are formed by injecting heavily doped impurity ions using a photoresist masking the DRAM peripheral region.

4. A method as claimed in claim 1, wherein the first ILD film is formed of a BPSG film.

5. A method as claimed in claim 1, wherein the second ILD film is formed of an SOG film.

6. A method as claimed in claim 1, the second ILD film has a thickness between 1900 Å and 2100 Å.

7. A method as claimed in claim 1, further comprising the steps of forming a silicide film on surfaces of the logic gate, the source regions, and the drain regions.

8. A method as claimed in claim 7, wherein the silicide film is formed by depositing a refractory metal on the entire surface including the source and drain regions and by performing an annealing process, and then by reacting the refractory metal with materials forming the logic gate, the source region, and the drain region.

9. A method claimed in claim 8, wherein the refractory metal is cobalt.

10. A method as claimed in claim 8, further comprising the step of removing the refractory metal, which remains without reacting with the metals forming the logic gate and source and drain regions, after forming the silicide film.

11. A method as claimed in claim 1, further comprising the step of performing a thermal annealing process at a low temperature, after forming the first ILD film.

12. A method as claimed in claim 1, further comprising the step of flattening the surface of the first ILD film, after forming the first ILD film.

13. A method as claimed in claim 1, further comprising the step of depositing an HLD film on the surface of the semiconductor substrate, after forming the plug.

* * * * *